United States Patent
Pham et al.

(10) Patent No.: US 11,041,916 B2
(45) Date of Patent: Jun. 22, 2021

(54) CHOPPED BIAS MAGNETIC FIELD SOLID-STATE SPIN SENSOR FOR LOW FREQUENCY MEASUREMENTS OF PHYSICAL QUANTITIES

(71) Applicant: Massachusetts Institute of Technology, Cambridge, MA (US)

(72) Inventors: Linh M. Pham, Arlington, MA (US); Erik M. Thompson, Waltham, MA (US); John F. Barry, Cambridge, MA (US); Kerry A. Johnson, Somerville, MA (US); Danielle A. Braje, Winchester, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/106,802

(22) Filed: Aug. 21, 2018

(65) Prior Publication Data

US 2020/0025835 A1 Jan. 23, 2020

Related U.S. Application Data

(60) Provisional application No. 62/548,096, filed on Aug. 21, 2017.

(51) Int. Cl.
*G01R 33/00* (2006.01)
*G01R 33/26* (2006.01)

(52) U.S. Cl.
CPC ......... *G01R 33/0017* (2013.01); *G01R 33/26* (2013.01)

(58) Field of Classification Search
CPC ............................ G01R 33/0017; G01R 33/26
See application file for complete search history.

(56) References Cited

U.S. PATENT DOCUMENTS

| | | | |
|---|---|---|---|
| 9,766,181 B2 | 9/2017 | Englund et al. | |
| 2010/0308813 A1* | 12/2010 | Lukin | G01R 33/032 324/244.1 |
| 2012/0001625 A1 | 1/2012 | Yamada et al. | |
| 2015/0090033 A1 | 4/2015 | Budker et al. | |
| 2015/0192532 A1* | 7/2015 | Clevenson | G01R 33/323 324/304 |
| 2015/0369881 A1* | 12/2015 | Ausserlechner | G01R 33/07 324/251 |
| 2017/0030982 A1* | 2/2017 | Jeske | G01R 33/032 |

(Continued)

OTHER PUBLICATIONS

Ajoy, A., et al., "DC Magnetometry at the T2 Limit," arXiv:1611. 04691v1 [quant-ph] Nov. 15, 2016. 15 pages.

(Continued)

*Primary Examiner* — Akm Zakaria

(74) *Attorney, Agent, or Firm* — Smith Baluch LLP

(57) ABSTRACT

Applying a bias magnetic field to a solid-state spin sensor enables vector magnetic field measurements with the solid-state spin sensor. Unfortunately, if the bias magnetic field drifts slowly, it creates noise that confounds low-frequency field measurements. Fortunately, the undesired slow drift of the magnitude of the bias magnetic field can be removed, nullified, or cancelled by reversing the direction (polarity) of the bias magnetic field at known intervals. This makes the resulting solid-state spin sensor system suitable for detecting low-frequency (mHz, for example) changes in magnetic field or other physical parameters.

22 Claims, 17 Drawing Sheets

(56) References Cited

U.S. PATENT DOCUMENTS

2017/0059666 A1* 3/2017 Horsley ............. G01R 33/0385
2017/0370979 A1* 12/2017 Braje ................... G01R 33/323
2018/0136291 A1 5/2018 Pham et al.

OTHER PUBLICATIONS

International Search Report and Written Opinion in International Patent Application No. PCT/US18/47222 dated Dec. 21, 2018. 10 pages.

Mateos, I., et al., "Low-frequency noise characterization of a magnetic field monitoring system using an anisotropic magnetoresistance," Sensors and Actuators A 235 (2015) 57-63.

Mateos, I., et al., "Noise characterization of an atomic magnetometer at sub-millihertz frequencies," Sensors and Actuators A 224 (2015) 147-155.

Wood, A.A., et al., "Improved sensitivity to magnetic fields by rotation of quantum sensors," arXiv:1802.03845v1 [quant-ph] Feb. 12, 2018. 7 pages.

* cited by examiner

METHOD A: Applying a bias magnetic field with fixed permanent magnets
(prior art)

a) Physical setup of magnets and solid state spin sensor b) Simulated bias magnetic field 270a — Permanent magnet
210 — Solid state spin sensor
270b — Permanent magnet

METHOD B: Applying a bias magnetic field with coils of wire and a fixed current source (prior art)
a) Physical setup of coils of wire and constant current source
b) Simulated bias magnetic field
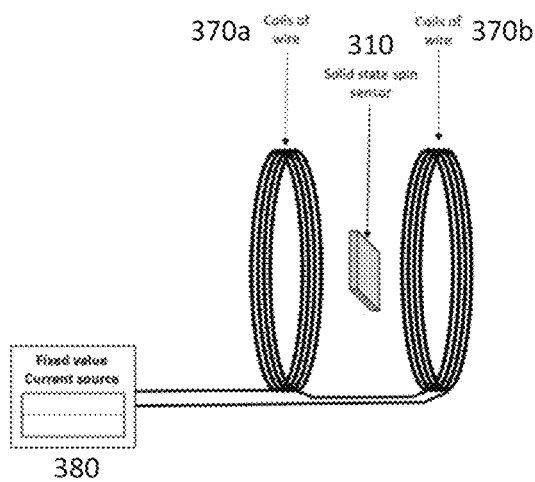
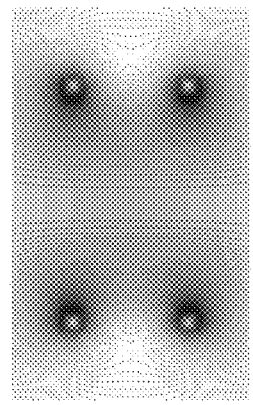
*FIG. 3A*  *FIG. 3B*

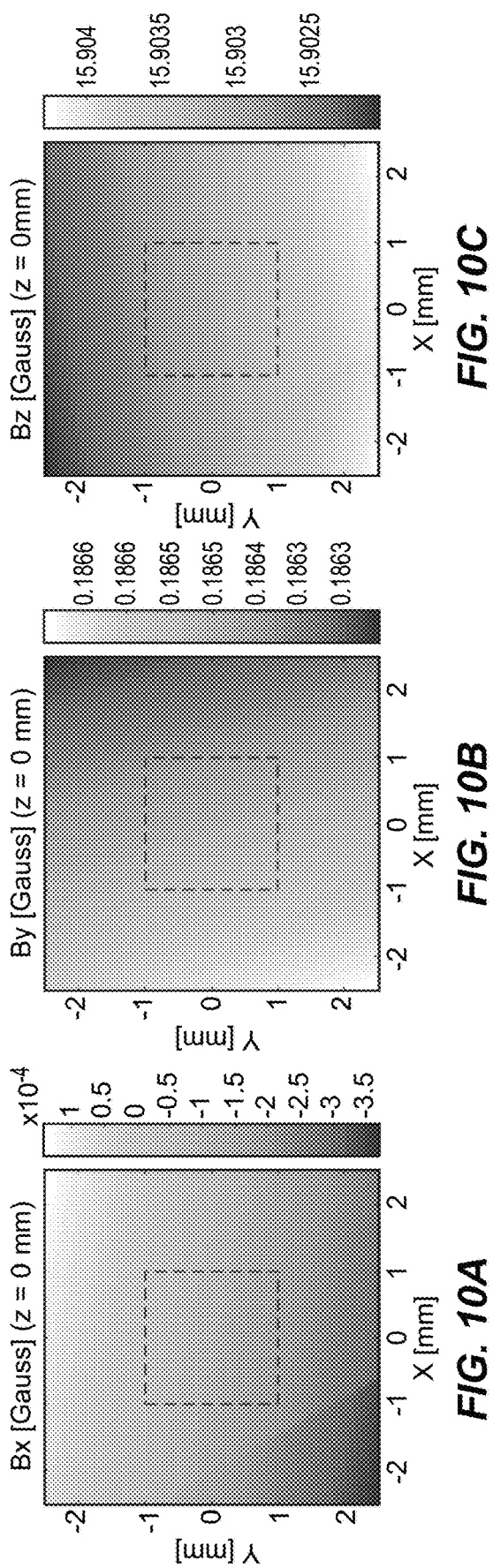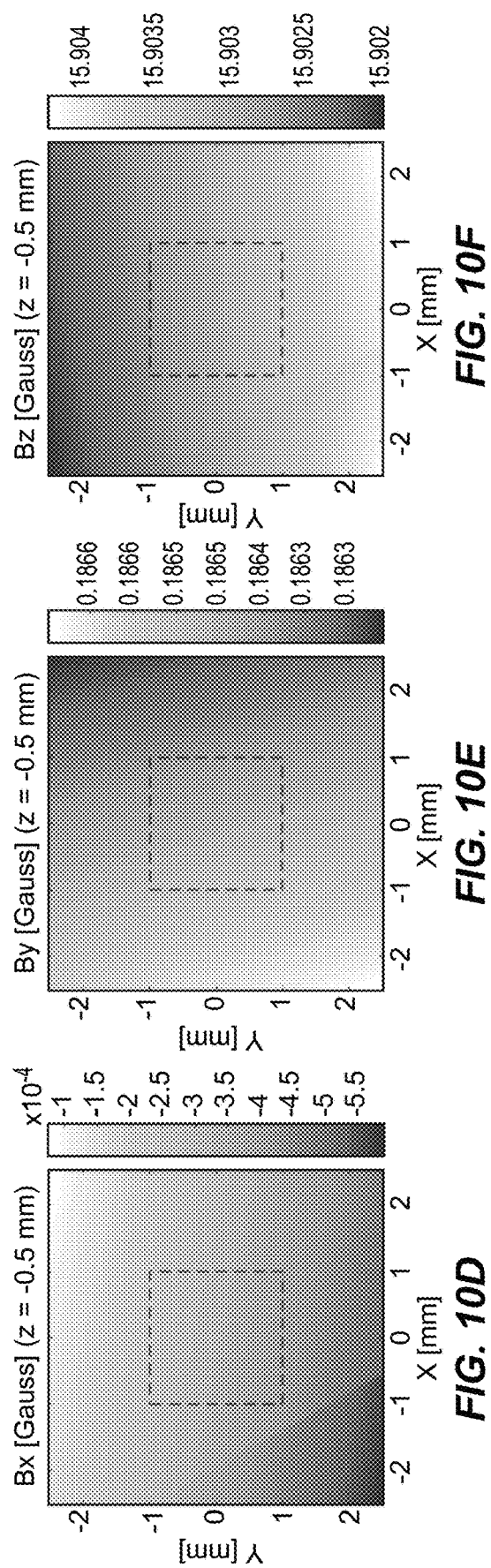
FIG. 10A  FIG. 10B  FIG. 10C
FIG. 10D  FIG. 10E  FIG. 10F

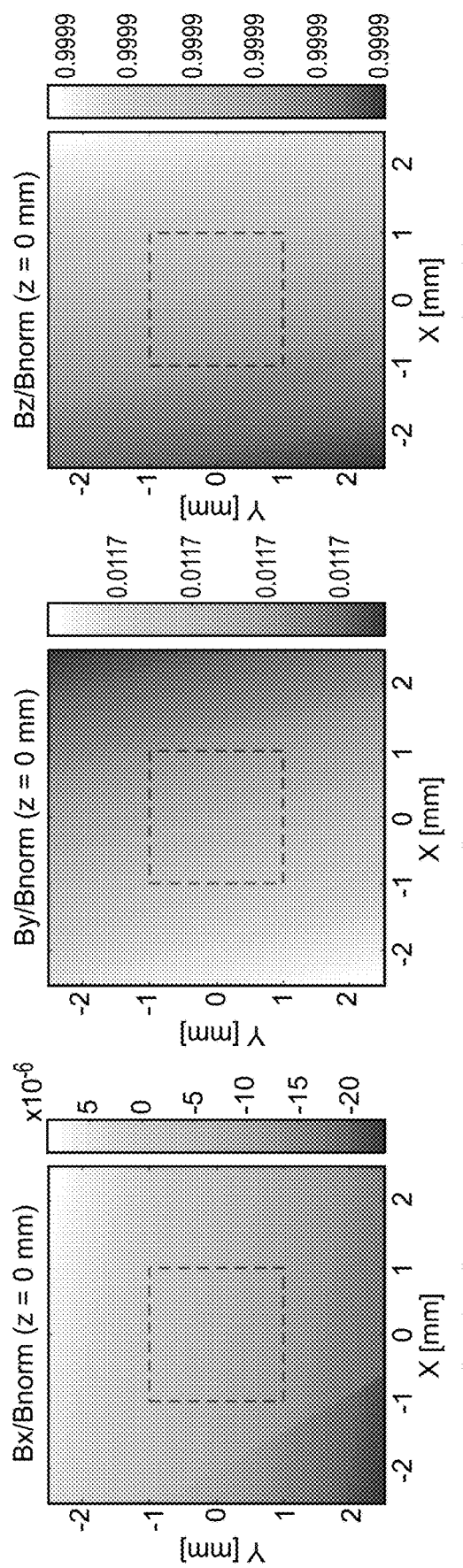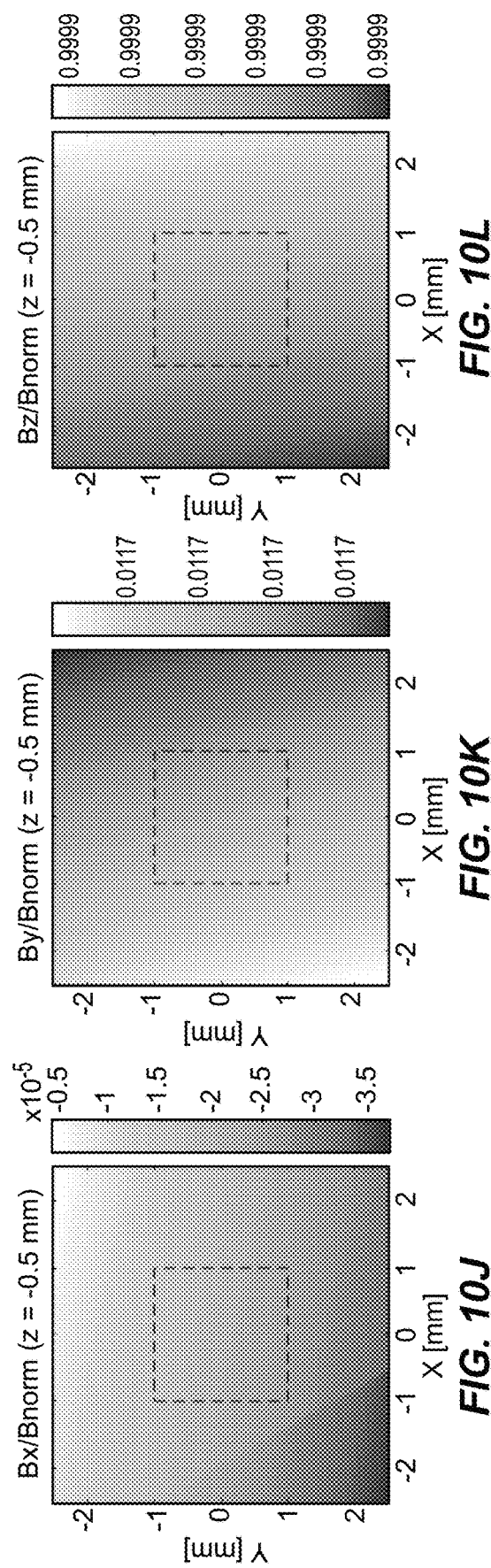

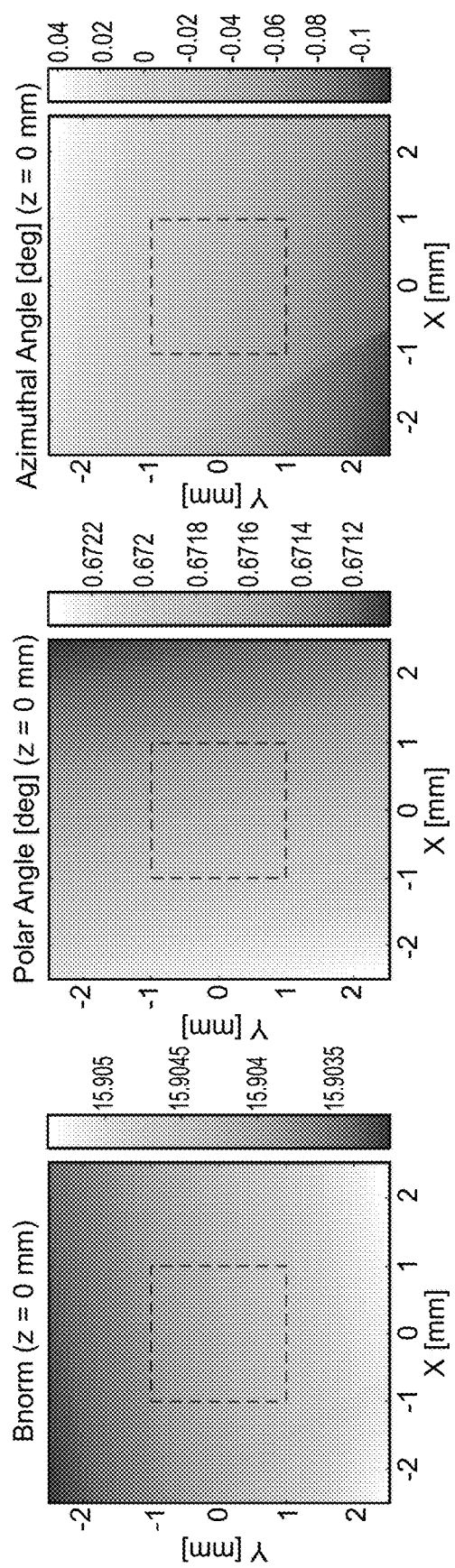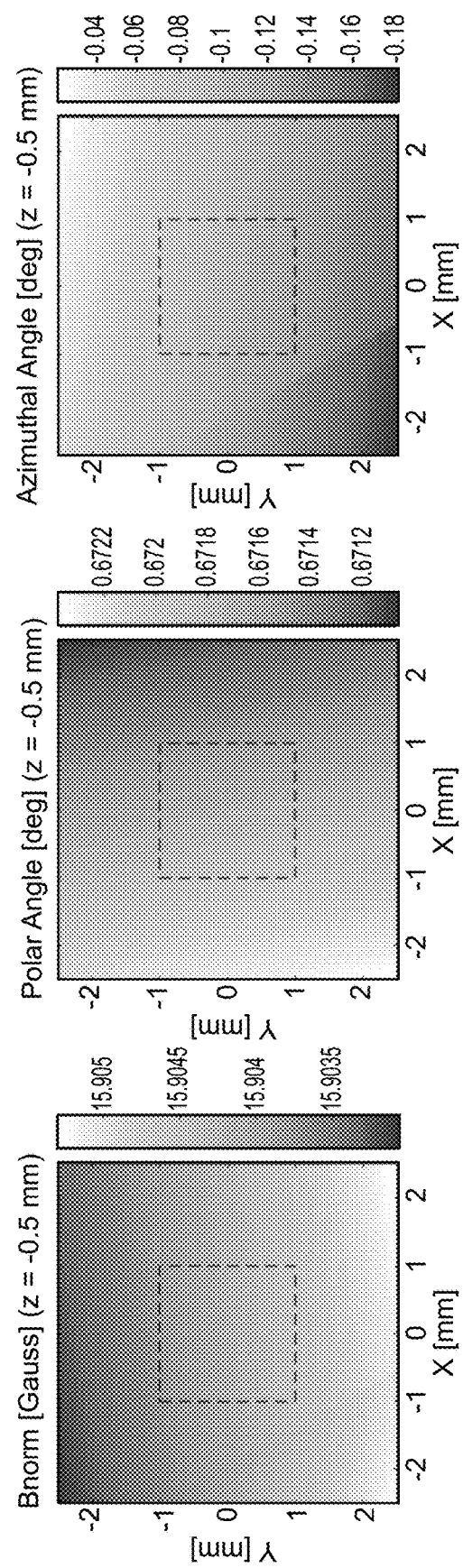

CHOPPED BIAS MAGNETIC FIELD SOLID-STATE SPIN SENSOR FOR LOW FREQUENCY MEASUREMENTS OF PHYSICAL QUANTITIES

CROSS-REFERENCE TO RELATED APPLICATION(S)

This application claims the priority benefit, under 35 U.S.C. § 119(e), of U.S. Application No. 62/548,096, entitled "Alternating Bias Magnetic Field Solid-State Spin Sensor for Low Frequency Measurements of Physical Quantities," which was filed on Aug. 21, 2017, and is incorporated herein by reference in its entirety.

GOVERNMENT SUPPORT

This invention was made with Government support under Contract No. FA8721-05-D-0001 awarded by the U.S. Air Force. The Government has certain rights in the invention.

BACKGROUND

Sensors based on solid-state spin systems offer a high-performance, low-cost, low-power platform for sensing or imaging of magnetic fields, electric fields, temperature, pressure, and other physical quantities, sometimes with resolution down to the nanoscale. A solid-state spin sensor employs color center defects (e.g., nitrogen vacancies), which are point-like defects in a solid-state host (e.g., diamond or silicon carbide), to measure physical quantities. The color center defects have quantum spin states that can be manipulated by optical and microwave radiation. Their quantum spin states can be made to be sensitive to certain physical parameters, such as magnetic field, and emit fluorescent light whose intensity depends on the defects' quantum spin state. The value of the magnetic field or other physical quantity to be measured is given by the energy levels of the quantum spin states of the color center defects or by the distribution of the color center defects between the different quantum spin states.

In some implementations, e.g., in magnetic field sensing, it is desirable to apply a bias magnetic field to the solid-state spin sensor. The bias magnetic field shifts the different quantum energy levels so that each quantum energy level can be distinguished from the other quantum energy levels, allowing each quantum energy level to be individually interrogated. Put differently, an appropriate bias magnetic field allows the color center defects' different quantum energy levels can be individually addressed and manipulated without affecting or manipulating the population residing in other quantum energy levels.

Under a suitable magnetic bias field, microwave and/or optical excitation radiation are applied to the solid-state spin sensor so that the physical quantity to be measured influences either the quantum energy levels or the distribution of the color center defects between the different quantum energy levels. The optical excitation radiation manipulates the quantum states of the color center defects in order to make a measurement of the physical quantity to be measured. Similarly, the microwave radiation manipulates the quantum spin states of the color center defects in order to make a measurement of the physical quantity to be measured.

The color center defects emit fluorescent light in response to the optical excitation radiation and the microwave radiation. The value of the physical quantity to be measured can be inferred from the quantity of the detected optical fluorescent light. The amount of detected optical fluorescent light typically depends in part on the color center defect's quantum state, which in turn depends on the value of the physical quantity to be measured.

SUMMARY

Embodiments of the present technology include methods of compensating for bias drift in a magnetic field measurement made with a solid-state spin sensor. An example method includes making a first magnetic field measurement of the solid-state spin sensor subject to an unknown external magnetic field and to a first bias magnetic field with a first polarity. Next, a second magnetic field measurement is made of the solid-state spin sensor subject to the unknown external magnetic field and to a second bias magnetic field with a second polarity opposite the first polarity. A magnitude of the unknown external magnetic field is determined with a sensitivity of less than about 1 nT/√Hz based on the first magnetic field measurement and the second magnetic field measurement.

The first magnetic field measurement may be made in about 1 millisecond to about 10 seconds. The first magnetic field measurement may include illuminating the solid-state spin sensor with a plurality of optical pulses and a plurality of microwave pulses while the solid-state spin sensor is subject to the first bias magnetic field. Making the second magnetic field measurement may involve switching from the first bias magnetic field to the second bias magnetic field within about 100 microseconds. And the method may include alternating between the first bias magnetic field and the second bias magnetic field at a first frequency and generating the first bias magnetic field and the second bias magnetic field with an amplitude variation of less than about 10-9/√Hz at frequencies higher than the first frequency.

Other embodiments of the present technology include methods of measuring an external magnetic field with a solid-state host that includes an ensemble of color center defects, each of which has at least one corresponding resonance. An example of this method includes applying a time-varying bias magnetic field to the color center defects. The time-varying bias magnetic field splits the resonances of the color center defects. The method also includes measuring shifts in the resonances of the color center defects caused by the external magnetic field and the time-varying bias magnetic field. And it includes determining a magnitude and/or direction of the external magnetic field based on the shifts in the resonances of the color center defects and the time-varying bias magnetic field.

In at least one case, applying the time-varying bias magnetic field comprises periodically reversing a polarity of the time-varying bias magnetic field. For example, the polarity can be reversed by alternating a direction of a current running through wire coils that generate the time-varying bias magnetic field. Alternating the direction of the current may occur at a rate of about 0.1 Hz to about 1 kHz, about 1 Hz to about 10 Hz, and/or within less than 100 microseconds. If desired, generating the time-varying bias magnetic field may be done with an amplitude variation of less than about $10^{-9}/\sqrt{Hz}$ at frequencies higher than a reversal frequency of the time-vary bias magnetic field.

Measuring the shifts in the resonances of the color center defects may include illuminating the color center defects with optical pulses and microwave pulses. In these cases, applying the time-varying bias magnetic field comprises reversing a polarity of the time-varying bias magnetic field at a reversal frequency lower than a pulse repetition frequency of the optical pulses. Alternatively, measuring the shifts in the resonances of the color center defects may comprise illuminating the color center defects with a continuous-wave optical radiation and a modulated microwave radiation. In these cases, applying the time-varying bias magnetic field comprises reversing a polarity of the time-varying bias magnetic field at a reversal frequency lower than a modulation frequency of the modulated microwave radiation.

In any of these examples, determining the magnitude and/or direction of the external magnetic field may comprise measuring the magnitude of the external magnetic field with a sensitivity of 1 nT/√Hz or less.

Yet another embodiment of the present technology includes a magnetic field sensor a solid-state host containing color center defects having respective resonances; a magnetic field source, at least one radiation source, and a detector, all in electromagnetic communication with the color center defects; and a processor operably coupled to the detector. In operation, the respective resonances shift in response to an external magnetic field. The magnetic field source applies a time-varying bias magnetic field to the color center defects that splits the respective resonances of the color center defects. The radiation source irradiates the color center defects with radiation. The detector detects a spectroscopic signature of the color center defects in response to the radiation. And the processor determines an amplitude and/or direction of the external magnetic field, e.g., with a sensitivity of 1 nT/√Hz or less, based on the time-varying bias magnetic field and the spectroscopic signature of the color center defects.

In some cases, the magnetic field source is configured to periodically reverse a polarity of the time-varying bias magnetic field. For instance, the magnetic field source may periodically reverse the polarity of the time-varying bias magnetic field at a rate of about 0.1 Hz to about 1 kHz or at a rate of about 1 Hz to about 10 Hz.

The magnetic field source may include coils in electromagnetic communication with the solid-state host and circuitry in electrical communication with the coils. In operation, the circuitry applies an alternating current to the coils. This circuitry may have a time constant of less than about 100 microseconds and may include a current source that generates the current with an amplitude variation of less than about $10^{-9}$ A/√Hz.

The radiation source may include a microwave source and a light source. In this case, the microwave source irradiates the color center defects with microwave radiation that manipulates respective quantum spin states of the color center defects. And the light source illuminates the color center defects with optical radiation that causes the color center defects to emit fluorescent light. The radiation source may apply the radiation as pulses at a pulse repetition frequency greater than a modulation frequency of the time-varying bias magnetic field.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 3A shows wire coils and a fixed current source for applying a bias magnetic field in a solid-state spin sensor.

FIG. 3B shows a simulated bias magnetic field from the wire coils and fixed current source of FIG. 3A.

FIGS. 10A-10R are plots of magnetic field strength from the simulations of FIGS. 9A and 9B

DETAILED DESCRIPTION

Solid-state spin sensors are an emerging sensing technology that employ color center defects in a solid-state material to measure one or more physical quantities. Sensors based on nitrogen-vacancy (NV) color center defects in diamond are one example of a solid-state spin sensor. Solid-state spin sensors may be used to measure physical quantities such as magnetic field, electric field, temperature, pressure, pH, or the presence of an atomic, molecular, or other hadronic species.

Solid-state spin sensors typically operate as follows. The color center defects within a solid-state spin sensor are illuminated via an optical excitation radiation, which is generated by an optical radiation source, such as a laser. Illumination with the optical excitation radiation causes the color center defects to emit a fluorescent light, which is collected by a light detector. The application of the optical excitation radiation to the color center defects may be accompanied by application of microwave radiation to the color center defects. The optical excitation radiation and the microwave radiation may be applied simultaneously or sequentially or a combination of simultaneously and sequentially. In some implementations, the microwave radiation is used to manipulate the population distribution between the quantum energy levels of the color center defects. The application of the optical and microwave radiation is arranged so that information pertaining to the physical quantity to be measured is encoded in the fluorescent light emitted by the color center defects. For example, if a diamond containing nitrogen-vacancy color center defects is illuminated with green light (495-570 nm) and appropriate microwave radiation, the diamond may emit red fluorescent light (630-850 nm) in proportion to a magnetic field (e.g., the physical quantity being measured).

Figure 1A:
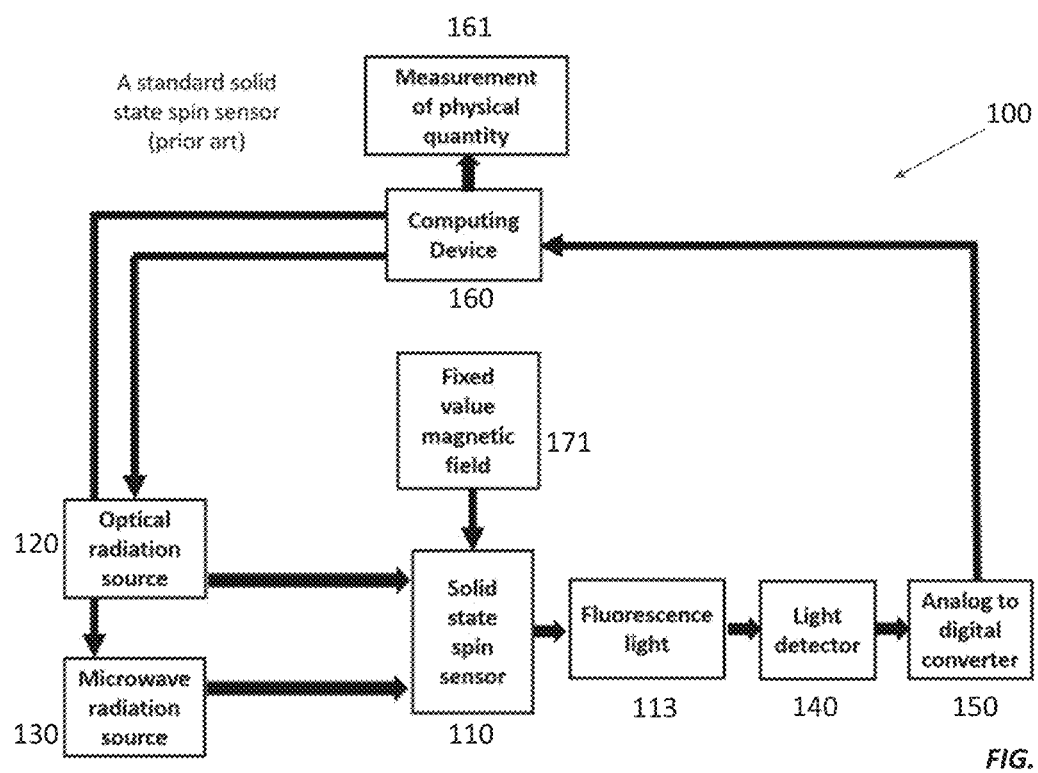
FIG. 1A is a block diagram of a conventional solid-state spin sensor.

FIG. 1A shows a schematic of a standard solid-state spin sensor 100. A fixed value bias magnetic field 171 is applied to a solid-state sensor 110, which comprises a solid-state host with an ensemble of color center defects. The fixed value bias magnetic field 171 is created using either one or more permanent magnets or using one or more wires (not shown) through which current is driven by a fixed value current source. In some implementations, the wires are arranged in one or more loops to create the bias magnetic field.

Microwave radiation and optical excitation radiation are applied to the solid-state spin sensor 110 with a microwave radiation source 130 and optical radiation source 120, respectively. A computing device 160 is used to control aspects of the microwave radiation and the optical excitation radiation, such as the power and spectral content. When excited by the optical excitation radiation, the color center defects in the solid-state spin sensor 110 emit fluorescent light 113, which is collected and sent to a light detector 140. The output of the light detector 140 is digitized by an analog-to-digital converter 150 and sent to a computing device 160. Given the known temporal and spectral properties of the applied microwave radiation and optical excitation radiation, along with the detected optical fluorescent light 113, the computing device 160 can calculate the value 161 of the physical quantity to be measured.

A problem for some applications envisioned for solid-state spin sensors is that the fixed value magnetic field of a standard solid-state spin sensor is not constant over time. The fixed value magnetic field is not constant in time typically due to unavoidable non-idealities in materials, such as non-zero thermal expansion, the dependence of a permanent magnet's magnetic field strength on temperature, inadequate ability to control environmental parameters (e.g., temperature or pressure), mechanical non-idealities such as material relaxation, etc. For example, if the fixed value magnetic field is $10^{-3}$ Tesla, this value may change by a small amount ($10^{-8}$ Tesla, for example) over some time interval (1 hour, for example) despite the best efforts of device engineers to prevent this change.

A drift of the fixed value magnetic field can degrade the solid-state spin sensor's performance. This degradation of the solid-state spin sensor's performance can prevent the solid-state spin sensor from being deployed for certain applications. Fortunately, this degradation can be avoided or mitigated by replacing the fixed value magnetic field with a magnetic field whose amplitude and direction are purposely varied in time. In some implementations, the amplitude and direction of the magnetic field are varied so that any slow drift in the amplitude or direction of the applied magnetic field can be removed. For example, slow drift over a period of one minute, one hour, or some other period of time can be cancelled by periodically reversing the direction of the applied magnetic field while the magnitude of the applied magnetic field is held constant. In this way, the solid-state spin sensor's performance is not hindered by slow drift in the magnitude of the bias magnetic field, and the solid-state spin sensor's performance is not degraded.

Magnetometry with a Solid-State Spin Sensor

One approach to performing magnetic sensing with a solid-state spin sensor (e.g., a diamond with NVs) is through optically detected magnetic resonance (ODMR) measurements. ODMR measurements take advantage of the behavior of the solid-state spin sensor under optical excitation to measure the transition frequencies between the electronic energy levels of the color center defects and the dependence of these electronic energy levels on magnetic fields. ODMR measurements also take advantage of the fact that microwave radiation that is resonant with, i.e., equal to the difference between, certain electronic energy levels can cause transitions between those electronic energy levels.

In the solid-state spin sensor, microwave excitation that is resonant with so-called dipole-allowed transitions, e.g., for $^{14}$NV and $^{15}$NV, can cause the spin state of the color center defects to transition between the two energy levels connected by the transition. Note, also, that under certain circumstances, resonant microwave excitation can drive even the so-called "forbidden" transitions.

Applying continuous optical and microwave excitation while sweeping the frequency of the microwave drive can yield an ODMR spectrum from which the transition frequencies of the color center defects in the solid-state spin sensor can be extracted. When the microwave drive frequency is not resonant with any transition, the optical excitation pumps the color center defects' spin into the $m_S=0$ state, causing the color center defects to fluoresce with maximum intensity. However, when the microwave is resonant with a transition (generally an $m_S=0 \rightarrow -1$ or $m_S=0 \rightarrow +1$ transition), some of the color center defects are cycled into the $m_S=\pm1$ state, resulting in a reduced fluorescence intensity. For a frequency-swept microwave drive, these reductions in fluorescence intensity correspond to allowed transition frequencies that manifest as resonance dips. This relationship among fluorescence intensity, optical excitation radiation, microwave excitation radiation and magnetic field makes it possible to determine the color center defect ground-state transition frequencies and thus extract, e.g., the magnetic field (among other physical phenomena), from the ODMR spectrum.

Figure 1B:
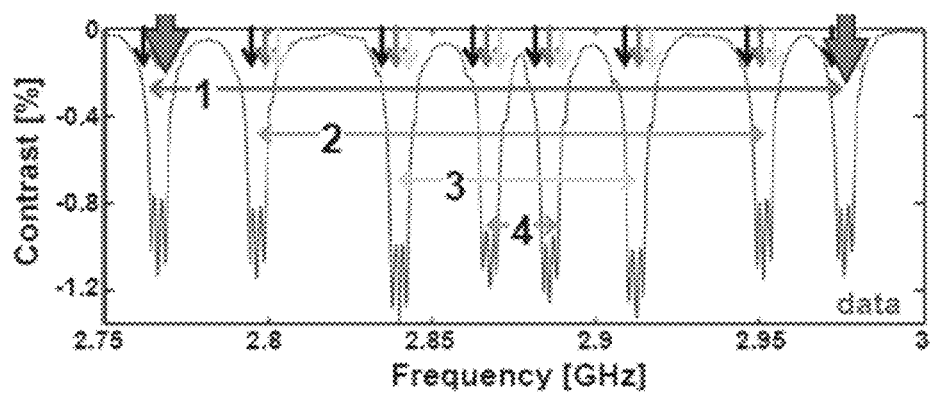
FIG. 1B is an example optically detected magnetic resonance (ODMR) measurement made using a conventional solid-state spin sensor with an ensemble of nitrogen vacancies in a diamond host.

FIG. 1B shows an ODMR spectrum for a solid-state spin sensor—here, an NV ensemble in a bulk diamond host—subject to an external magnetic field. Diamond has a tetrahedral lattice structure, so the NV centers may occupy any of eight possible orientations, corresponding to four orientation classes, where each orientation class contains two orientations with the same symmetry axis but where the nitrogen and the vacancy in the NV are in opposite lattice sites. Each NV center may experience a different local field and hence exhibit a different change in resonance frequency.

Applying a bias magnetic field to the NVs disambiguates the resonance frequency shifts due to the external magnetic field by splitting the NV resonances. The bias magnetic field splits a given NV's resonance by an amount given approximately by the vector projection of the bias magnetic field along the NV's symmetry axis. If the bias magnetic field is aligned with the NV's symmetry axis, it will cause the NV's resonance to split into widely separated upper and lower resonance dips. If the bias magnetic field is orthogonal to the NV's symmetry axis, it may not split the NV's resonance at all. Generally, the bias magnetic field is aligned so that it splits the resonances of each of the four orientation classes by a different amount.

Applying an unknown magnetic field to an NV diamond sensor under a bias magnetic field causes each resonance to shift by an additional amount proportional to the vector projection of the unknown magnetic field on the corresponding NV symmetry axis. The magnitudes of these resonance shifts represent the magnitude of the unknown magnetic field. And comparing the magnitudes of these resonance shifts to the magnitudes of the resonance shifts induced by the bias magnetic field makes it possible to determine the orientation of the unknown magnetic field with respect to the (known) orientation of the bias magnetic field. Consequently, measuring the resonances of an NV ensemble, which contains NVs in all four orientation classes, under a known bias magnetic field automatically yields full magnetic field vector information, where the vector axes are tied to the stable diamond lattice.

The ODMR spectrum shown in FIG. 1B was obtained by sweeping the microwave frequency from about 2.75 GHz to about 3.0 GHz, which encompasses the $D_{gs} \approx 2.87$ GHz zero-field-splitting of an NV center, while applying a magnetic field to the NV ensemble. The applied magnetic field had unequal projections along each of the four symmetry axes corresponding to the four NV orientation classes, with the resonance pairs corresponding to each of the four NV orientations labeled by horizontal arrows and indicated with labels 1-4 in order of highest magnetic field projection along the NV symmetry axes (1) to lowest magnetic field projection along the NV symmetry axis (4). Due to the separation in the energy level, transitions to the $m_s=+1$ and $-1$ levels can be distinguished in the ODMR measurement by their different frequencies corresponding to the different energy separations.

Why Variation of the Bias Magnetic Field is Problematic

Figure 2A:
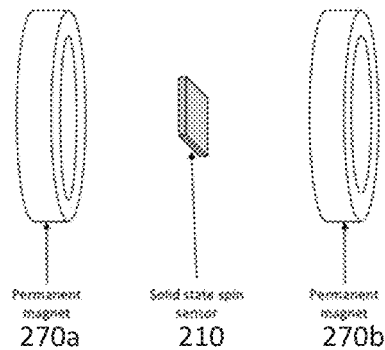
FIG. 2A shows fixed permanent magnets for applying a bias magnetic field in a solid-state spin sensor.
Figure 2B:
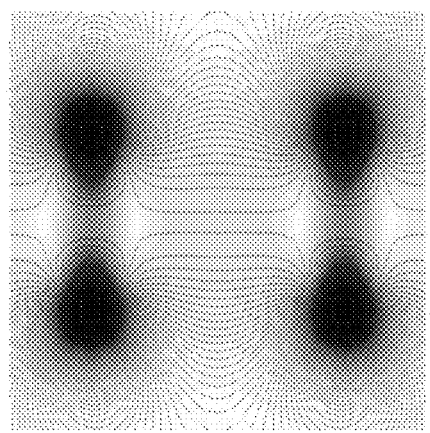
FIG. 2B shows a simulated bias magnetic field from the fixed permanent magnets of FIG. 2A.

To date, high-performance ensemble solid-state spin sensors that use a bias magnetic field for operation employ one of two methods to create the necessary bias magnetic field. FIG. 2A shows one method, denoted "Method A," which employs one or more permanent magnets 270a and 270b (e.g., NdFeB, SmCo, Alnico, ferrite, or some other permanent magnetic material) to create a static bias magnetic field, shown in FIG. 2B (simulation). In this example, the permanent magnets 270a, 270b are ring-shaped and create axially symmetric magnetic field lines.

In some implementations, the permanent magnets 270a and 270b are located in proximity to a solid-state spin sensor 210 (e.g., NVs in diamond). For example, one permanent magnet may be located 10 cm away from the solid-state spin sensor. In another example, two magnets (e.g., magnets 270a and 270b in FIG. 2) may be located 15 cm inches away from the solid-state spin sensor 210. In another example, magnetic material may be deposited (e.g, via sputtering) directly on or very proximal to (<1 cm) the solid-state spin sensor 210 for implementing chip-scale devices.

FIGS. 3A and 3B show another method, denoted "Method B," of generating a bias magnetic field. This method employs one or more sections of wire (here, two circular wire loops 370a and 370b on two sides of a solid-state spin sensor 310) and a current source 380 that drives a fixed amount of current through the wires 370. This fixed current creates a static bias magnetic field for the solid-state spin sensor 310. FIG. 3B shows a radially symmetric simulation of the static magnetic field lines generated by the fixed current running through the coils 370a and 370b. There are many possible wire configurations, the most common of which is known as a Helmholtz coil and employs two circular clusters of wires (e.g., as in FIG. 3A). An alternative configuration, known as a Maxwell coil, uses three clusters of circular loops of wires.

It is also possible to create a static bias magnetic field using a combination of Method A and Method B. For example, the bias magnetic field can be created using a Helmholtz coil configuration of wires driven by a fixed value current source in addition to a single permanent magnet.

Methods A and B each exhibit an unfortunate deleterious effect: when used to create a static bias magnetic field for a solid-state spin sensor employed to measure certain physical parameters, they create a drift in the bias magnetic field cannot be distinguished from a change in the physical quantity (e.g., magnetic field) being measured. This is most clearly illustrated for implementations where the solid-state spin sensor is used to measure an external magnetic field. In this case it is difficult if not impossible to distinguish a change in the external magnetic field being measured from a change due to unwanted drift in the bias magnetic field.

A drift or variation in the bias magnetic field can mimic a spurious signal in the physical quantity to be measured. In some implementations, the drift or variation in the bias magnetic field may not be problematic. For example, if the variation in the bias magnetic field causes a spurious signal whose amplitude is small relative to the signal caused by the physical parameter to be measured, the drift or variation can be ignored. Likewise, if the variation in the bias magnetic field occurs within a frequency band far from the frequency band containing the signal being measured, the drift or variation can be filtered out. However, if the variation of the bias magnetic field is of comparable size and occurs in the same or a similar frequency band as the signal being measured, the measured signal may contain an additional spurious signal due to the undesired change in the bias field. This can corrupt the measurement and is undesirable.

The temporal variation of the bias field may become worse and worse at lower and lower frequencies. For example, the temporal variation of the bias magnetic field may display a 1/f spectral noise profile, where f is the frequency at which the variation is measured. The low frequency magnetic field drift may arise from multiple sources. In implementations where the solid-state spin sensor is configured to measure a magnetic field, a change in the bias magnetic field may be recorded as a real (non-spurious) magnetic signal, even though this signal arises from a non-ideality in the device itself.

For Method A, changes in the temperature of the magnet (s), changes in the pressure applied to the magnet(s) by their mounts, or changes in atmospheric pressure can cause the bias magnetic field to change in magnitude. Similarly, thermal expansion, caused by a variation in ambient temperatures, may cause the distance between the magnet and the solid-state spin sensor to change. This changing distance between the solid-state spin sensor and permanent magnet can cause the value of bias magnetic field measured by the solid-state spin sensor to change. For Method B, temporal variation of the bias magnetic field may be caused by thermal drift of the electronic components, thermal expansion of the magnetic field coils, or some other cause.

Technical Discussion of the Problem

To see how low-frequency drift in the bias magnetic field can be problematic for some solid-state spin sensors, consider the case of a solid-state spin sensor configured to measure magnetic fields. The solid-state spin sensor is subject to a $10^{-3}$ Tesla (10 Gauss) bias magnetic field created by a single permanent magnet that is located 10 cm from the solid-state spin sensor. The bias magnetic field experienced by the solid-state spin sensor depends on the distance between solid-state spin sensor and the permanent magnet.

Figure 4:
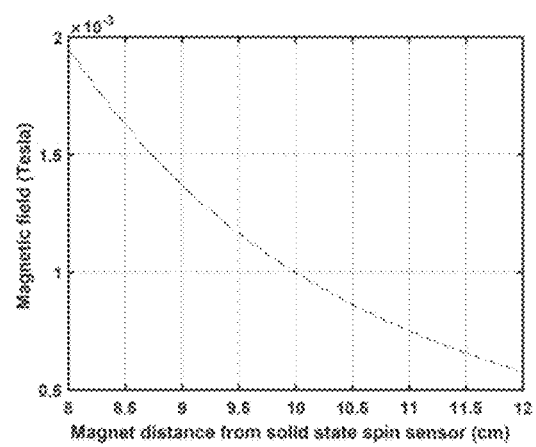
FIG. 4 is a plot of magnetic field strength versus magnet distance from the solid-state crystal in the solid-state spin sensor.

For simplicity, consider a simple model that treats the single permanent magnet as a point source (i.e., assume that the spatial extent of the permanent magnet can be ignored). The bias magnetic field is denoted by the vector $\vec{B}_{bias}$. The magnitude of the bias magnetic field at the location of the solid-state spin sensor, denoted $|\vec{B}_{bias}|$, will vary with axial distance between the permanent magnet and the solid-state spin sensor as approximately $|\vec{B}_{bias}| \sim 1/r^3$, so that $d|\vec{B}_{bias}|/dr \sim -3|\vec{B}_{bias}|/r$. FIG. 4 is a plot of $|\vec{B}_{bias}|$ for this example. For the dimensions given above, this corresponds to $-3 \times 10^{-3}$ Tesla/(10 cm)=−0.03 Tesla/meter. For a device with a desired sensitivity of 1 pT/√Hz over a period of 1000 seconds, this means that the permanent magnet should not move with respect to the solid-state spin sensor by more than approximately 30 picometers over 1000 seconds. Although such tight tolerances on spatial position over 1000 seconds may be possible in a laboratory setting using laser interferometric methods, such a solution is unsuitable for a sensor that is small, low-cost, low-power, and portable.

The requirements for the spatial position of the permanent magnet in the above example can be relaxed by small factors (by a factor of two, for example) using a variety of approaches: employing a larger magnet located farther away from the solid-state spin sensor; using arrays of magnets to generate a uniform bias field; employing ultra-low thermal expansion materials to ensure the magnet-to-sensor distance is held fixed; or other methods. While such approaches may partially alleviate the problem of the magnet position changing, they cannot provide orders of magnitude improvement in the positional stability of the magnet at mHz frequencies.

However, the difficulty with Method A extends beyond holding the position of the magnet fixed relative to the solid-state spin sensor. Permanent magnet materials have some non-zero temperature coefficient, as shown in the Table below:

| Permanent Magnet Material | Temperature Coefficient $B_r$ (%/° C.) |
| --- | --- |
| NdFeB (sintered) | −0.11 |
| NdFeB (Injection bonded) | −0.1 |
| NdFeB (compression bonded) | −0.11 |
| SmCo (sintered, 2:17) | −0.03 |
| SmCo (sintered, 1:5) | −0.04 |
| Ferrite (Injection bonded) | −0.2 |
| Ferrite (Sintered, ceramic) | −0.18 |
| Alnico (Cast) | −0.025 |
| Alnico (sintered) | −0.025 |
| SmCo (temperature stabilized formulation) | ±.001 |

Because the magnetic field of a permanent magnet changes with temperature, holding the magnitude of the bias magnetic field stable to a given value may require holding the magnet temperature with in certain range. For example, the data above suggest that to hold a $10^{-3}$ Tesla field constant at the $10^{-12}$ Tesla level, the temperature of a magnet fabricated from the best commercially available magnet material (a temperature-drift minimized formulation of SmCo) should be kept within a range of about 0.1 mK. This level of performance, while possibly attainable in a laboratory setting, is near state-of-the-art, and undesirable for a solution which is small, low-cost, low-power, and, portable.

In additional to dimensional stability, and thermal stability of the magnet itself, similar or larger drifts can be introduced by other factors. For example, vibration, mechanical creep, changing pressure on the magnet, etc. can each lead to long-term drift or changes in the magnitude of the bias magnetic field as seen by the solid-state spin sensor.

The magnitude of a magnetic field created by Method B varies over long periods of time (for example, a minute or an hour) as well. The Method B approach to generate the bias magnetic field uses one or more wires and a current source. The current is driven through the wires in order to create the bias magnetic field. One example of this configuration of a current source and one or wires is known as the Helmholtz configuration, which employs two clusters of circulator loops of wires spaced by the loop radius to create a bias magnetic field.

Figure 5:
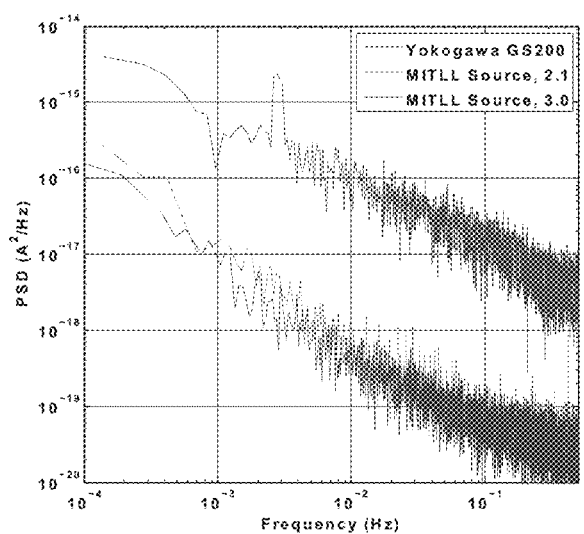
FIG. 5 is a plot of power spectral density (PSD) of the current noise versus frequency for different current sources.

Unfortunately, making a bias magnetic field using a current source and one or more wires has drawbacks. For example, even state-of-the-art precision current sources suffer from low frequency noise as shown in FIG. 5 for three different current sources. Any noise (amplitude variation) in the current from the current source translates directly to noise in the bias magnetic field. For example, if the current source supplies X amperes of current and the current source noise is Y Amperes/√Hz at frequency f and the wire configuration generates a bias magnetic field with magnitude | $\vec{B}_{bias}$|, the amplitude noise in the applied bias magnetic field should equal $$\frac{Y}{X} \times |\vec{B}_{bias}|.$$

The current noise depicted in FIG. 5 is fairly typical; the power spectral density displays 1/f noise due to thermal drift of the components, etc., at low frequencies and decreases for higher frequencies. Moreover, the method of generating the bias magnetic field with one or more wires and a current source is sensitive to slow changes in the wire locations relative to the solid-state spin sensor due to thermally induced expansion and contraction. The changes in wire locations relative to the solid-state spin sensor can affect the magnitude or direction of the applied bias magnetic field. If the wires move due to low frequency thermal drift, the magnitude or direction of the applied bias magnetic field may change by a corresponding amount.

Although sensors that use Method A, Method B, or a combination thereof can measure physical quantities at frequencies well above 0 Hz (100 Hz or higher, for example), they are not suitable for lower-frequency measurements because of low-frequency drift of the magnitude or direction of the bias magnetic field. More specifically, neither Method A, nor Method B, nor any combination thereof can create a bias magnetic field for a device intended to detect changes in a physical parameter in the mHz frequency range.

The AC Bias Field Solution

Figure 6A:
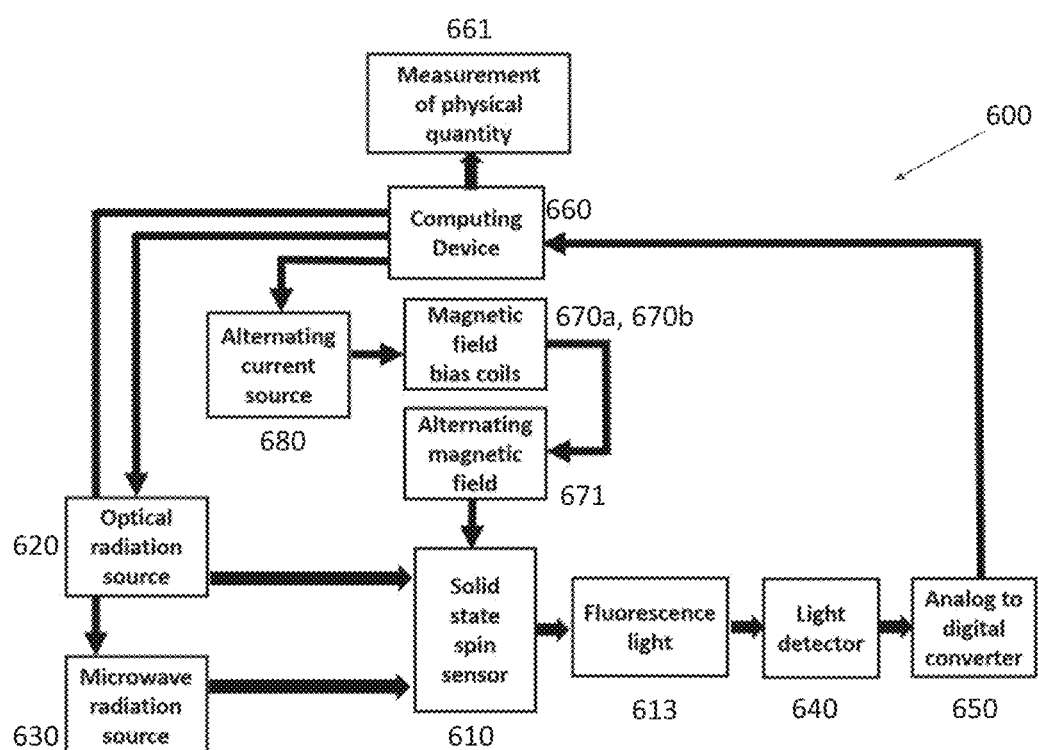
FIG. 6A is a block diagram of a solid-state spin sensor with a chopped bias magnetic field.
Figure 6B:
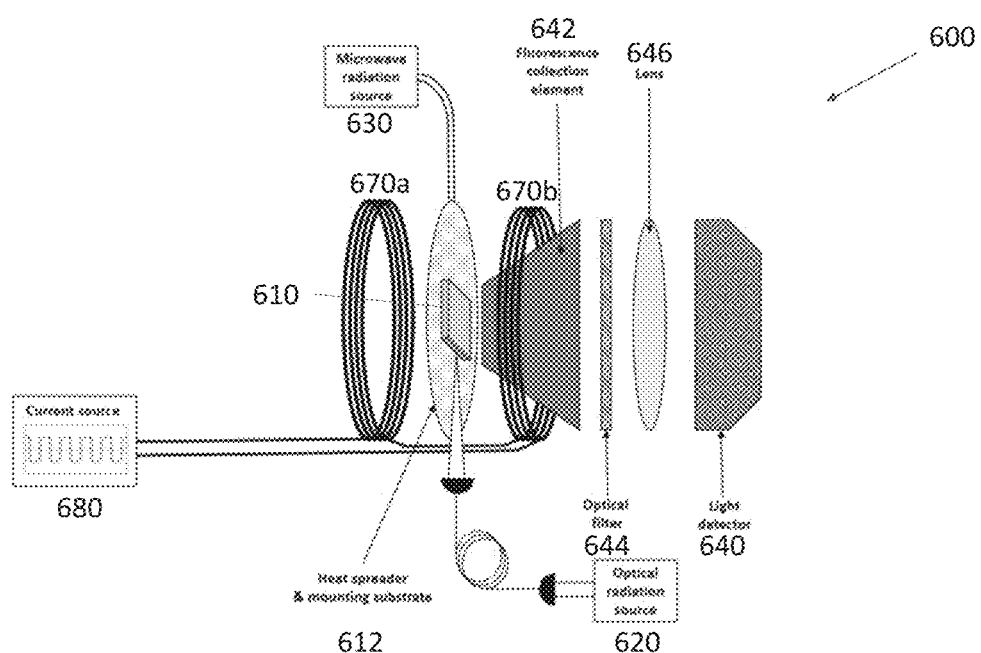
FIG. 6B is a schematic diagram of a solid-state spin sensor with a chopped bias magnetic field.

FIGS. 6A and 6B show a solid-state spin sensor system 600 that uses a time-varying or chopped bias magnetic field to remove, nullify, or cancel the slow drift of the magnitude of the bias magnetic field when measuring magnetic field or another physical parameter. This system 600 employs a bias magnetic field which is reversed in direction at known intervals. Reversing the direction, or polarity, of the bias magnetic field makes the solid-state spin sensor system 600 suitable for detecting low frequency (mHz, for example) changes in external magnetic fields and other physical parameters.

FIG. 6A shows a block diagram of the system 600, which includes a solid-state spin sensor 610, such as a bulk diamond with an ensemble of color center (e.g., NV) defects, mounted on a heat-spreading substrate 612. The solid-state spin sensor 610 close to wire coils 670a and 670b. These coils 670a and 670b may be Helmholtz coils, a Maxwell coil, or any other suitable shape. The coils 670a and 670b are connected to a low-noise current source 680, which is controlled by a computing device (e.g., a controller or processor) 660 that also controls an optical radiation source 620 and a microwave radiation source 630. The processor 660 is also connected to a detector 640, with a fluorescence collection element 642, filter 644, and lens 646 between the detector 640 and the solid-state spin sensor 610.

Unlike in a conventional solid-state spin sensor system, the computing device 660 reverses the polarity of the bias magnetic field applied to the solid-state spin sensor 610 by the coils 670a and 670b. In this case, the bias magnetic field direction follows a square-wave pattern (i.e., the bias magnetic field is simply reversed at a fixed frequency f): the computing device 660 causes the analog current source 680 to reverse the current applied to the coils 670a and 670b. The sign of the current is controlled by a digital signal, such as a time-triggered latch (TTL), which is sent to the analog circuit 680 by the computing device 660. (The design of the analog circuit 680 allowing this capability is discussed below.) The processor 660 may also adjust the optical source and microwave source as necessary to account for, as an example, significant resonant frequency differences in each bias polarity state.

The output of the current source 680 is fed into a pair of bias magnetic field coils 670a and 670b. The bias magnetic field coils 670a and 670b may be in Helmholtz configuration, Maxwell configuration, or any other configuration. The bias magnetic field coils 670a and 670b may be circular, square, hexagonal, or any other suitable shape. The periodically reversed current driven though the bias magnetic field coils 670a and 670b creates an alternating bias magnetic field 671 whose polarity reverses or flips at a periodic interval.

FIG. 6B shows another view of the solid-state spin sensor system 600. The solid-state spin sensor 610 is mounted to a substrate 612, which provides a stable mounting surface and also dissipates heat from the solid-state spin sensor 610. The substrate 612 may be constructed of silicon, diamond, silicon carbide, or another material.

The solid-state spin sensor 610 is illuminated by an optical radiation source 620. The optical radiation source 620 may be a laser, a light emitting diode, a spectrally filtered lamp, or any other optical source. The optical radiation source 620 may be spatially located away from the solid-state spin sensor 610. Its output may be delivered to the solid-state spin sensor 610 via an optical fiber, a light pipe, one or more mirrors, or by another light delivery system.

Microwave radiation from the microwave radiation source 630 is delivered to the solid-state spin sensor 610 via one or more conductive layers (not shown) that are located on either the solid-state spin sensor 610, the substrate 612, or both. This conductive layer is known as the microwave application structure and can include a combination of electrically conductive materials and electrically insulating materials. For example, the microwave application structure may be formed of a two-dimensional pattern of electrically conductive material and electrically insulating material.

The microwave application structure is used to apply the microwave radiation to the solid-state spin sensor 610. The microwave application structure may be created via electron evaporation, thermal evaporation, 3D printing, metallic stickers, or other methods. The microwave application structure can employ either resonant structures to reduce the power consumption by the device 600, transmission line structures that are broadband and tend to use more power than a resonant structure, or another structure to apply the microwave radiation to the solid-state spin sensor 610. Suitable structure shapes include a strip line resonator, split ring resonator, straight rod dipole resonator, quarter wavelength resonator, multiple coupled resonators, microstrip resonator, strip line transmission line, coaxial transmission line, patch antenna, and microstrip transmission line. In some implementations, the microwave application structure also functions to adhere the semi-insulating silicon carbide 612 to the solid-state spin sensor 610.

Fluorescence 613 emitted by the color center defects in the solid-state spin sensor 610 is collected by a fluorescence collection element 642. There are many ways to increase the fraction of photons that are successfully guided to the light detector 640 (relative to the total number of emitted optical fluorescence photons). One way is to use a high numerical aperture objective or a high numerical aperture lens 642 as shown in FIG. 6B. Other methods include the use of a parabolic reflector, an ellipsoidal and hemispherical reflector combination, or a light pipe. Further examples include collecting light from multiple faces of the solid-state spin sensor 610 and the use of a parabolic concentrator.

The fluorescence 613 is passed through an optical filter 644. The optical filter 644 may be an interference filter, colored glass, or a combination of interference filter and colored glass. The optical filter 644 removes light at the excitation wavelength from the fluorescence. Thereafter, one or more lenses 646 focus the collected fluorescent light 613 onto a light detector 640. The light detector 640 may be a photodiode, an avalanche photodiode, a photomultiplier tube, a charge coupled device camera, a complementary metal oxide semiconductor camera, or other light detector.

In this example, the coils 670a and 670b are arranged in a nearly solenoidal configuration around the sensor, with one wider-pitch turn in the middle of the solenoid to provide optical access for the optical radiation source to excite the solid-state spin sensor 610. (The coils can be arranged in other configurations as well.) There are eight total loops of wire in proximity to the solid-state spin sensor. These coils 670a and 670b are described in greater detail below.

Measurement and Determination of an External Magnetic Field

To see how the system 600 shown in FIGS. 6A and 6B measures an (unknown) external magnetic field $\vec{B}_{ext}$, consider a bias magnetic field defined as $\vec{B}_{bias}$, where $\vec{B}_{bias}^{fwd}$ and $\vec{B}_{bias}^{rev}$ depict the bias magnetic field with current run through the magnetic field coils 670*a* and 670*b* in the forward and reverse directions, respectively. In the idealized case, the magnitudes of the forward and reverse currents should be equal, so that $|\vec{B}_{bias}^{fwd}|=|\vec{B}_{bias}^{rev}|$. In some implementations $|\vec{B}_{ext}|<<|\vec{B}_{bias}^{fwd}|$ and, equivalently, $|\vec{B}_{ext}|<<|\vec{B}_{bias}^{rev}|$.

Figure 7A:
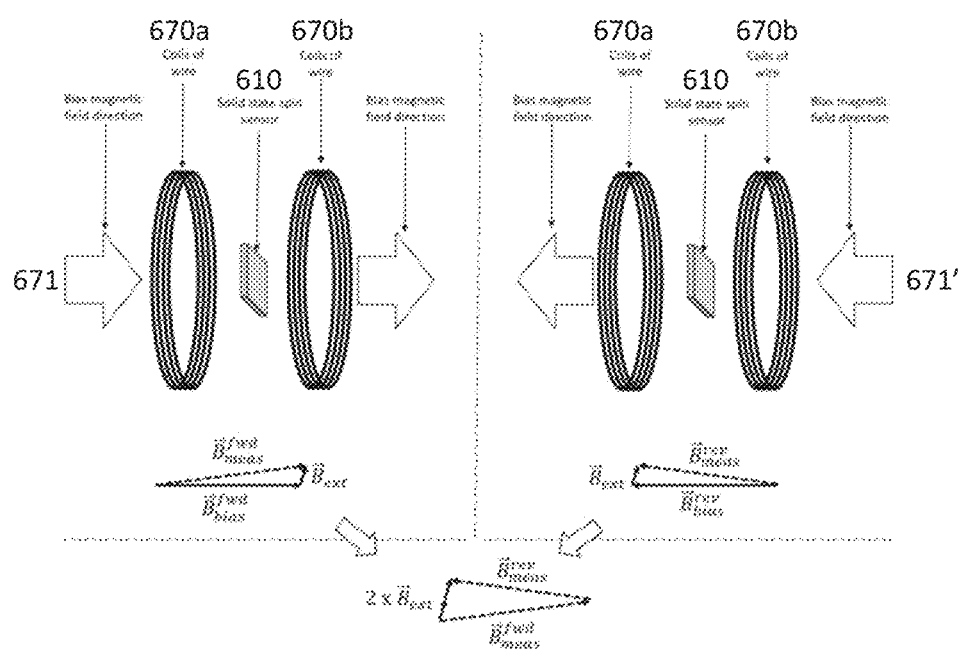
FIG. 7A illustrates how to measure an unknown external magnetic field using a chopped bias magnetic field.
Figure 7B:
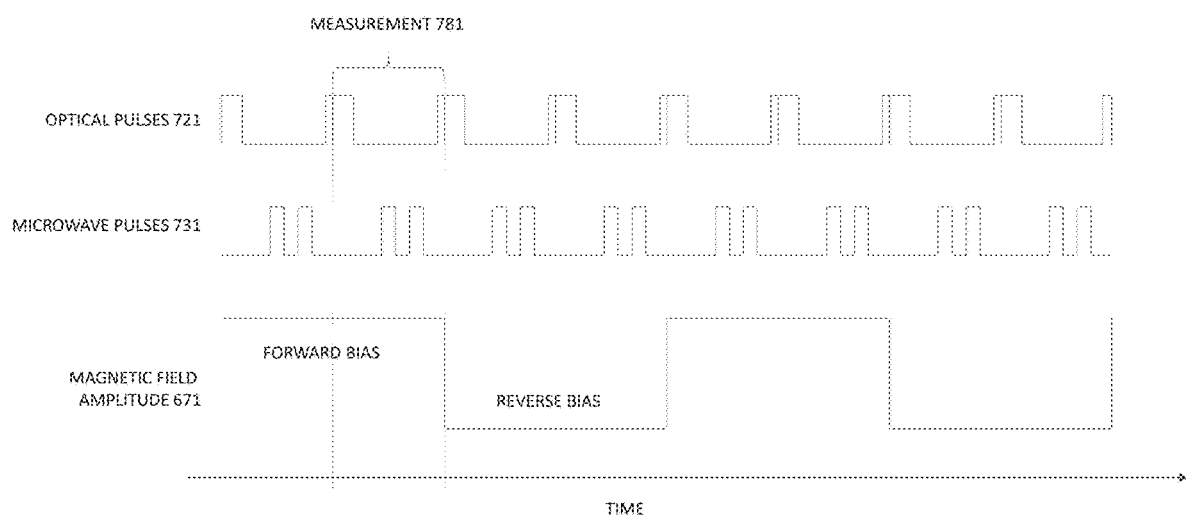
FIG. 7B illustrates timing for magnetic field measurements using pulsed optical and microwave radiation and a time-varying (chopped) bias magnetic field.

FIGS. 7A and 7B illustrate external magnetic field measurements using a solid-state spin sensor whose bias magnetic field changes polarity at known intervals. FIG. 7A illustrates the process of reversing the direction of the magnetic bias field and the vector addition of $\vec{B}_{meas}^{fwd}$ and $\vec{B}_{meas}^{rev}$ in order to determine $\vec{B}_{ext}$. Current is driven through the bias magnetic field coils 670*a* and 670*b* in the forward direction by the analog circuit 680 to apply a forward-bias magnetic field to the solid-state spin sensor 600. The optical radiation source 620 illuminates the solid-state spin sensor 600 with continuous-wave radiation or one or more optical pulses 721 as shown in FIG. 7B. The microwave radiation source irradiates the solid-state spin sensor 600 with pulsed radiation 731 as shown in FIG. 7B or frequency-modulated, continuous-wave microwave radiation while the forward-bias magnetic field splits the resonances of the color center defects in the solid-state spin sensor 600 as described above with respect to FIGS. 1A and 1B.

Because the external magnetic field is also present, the system 600 measures a total magnetic field equal to the vector sum of the external magnetic field and the forward bias magnetic field:

$$\vec{B}_{meas}^{fwd}=\vec{B}_{bias}^{fwd}+\vec{B}_{ext}.$$

Subsequently, current is driven through the bias magnetic field coils in the reverse direction by the analog circuit 680. Again, the optical radiation source 620 illuminates the solid-state spin sensor 600 with one or more optical pulses and the microwave radiation source irradiates the solid-state spin sensor 600 with pulsed or continuous-wave microwave radiation to measure the total magnetic field. When the current is run through the bias magnetic field coils 670*a* and 670*b* in the reverse direction, the device 600 measures a total magnetic field equal to the vector sum of the external magnetic field and the reverse bias magnetic field.

$$\vec{B}_{meas}^{rev}=\vec{B}_{bias}^{rev}+\vec{B}_{ext}.$$

Because the device 600 measures $\vec{B}_{meas}^{fwd}$ and $\vec{B}_{meas}^{rev}$ directly, the value of $\vec{B}_{ext}$ is extracted from the measurements of $\vec{B}_{meas}^{fwd}$ and $\vec{B}_{meas}^{rev}$. As shown in FIG. 7A, the value of the external magnetic field $\vec{B}_{ext}$ is equal to the average of the measurement under forward and reverse bias magnetic fields:

$$\vec{B}_{ext}=\frac{\vec{B}_{meas}^{rev}+\vec{B}_{meas}^{fwd}}{2}.$$

The measurement process shown in FIG. 7A can be varied in a variety of ways. For instance, the system 600 may measure the $\vec{B}_{ext}$ many times (e.g., using many sets of optical pulses 721 and microwave pulses 731) during each period of forward or reverse bias magnetic field as shown in FIG. 7B. Each measurement 781 can be averaged with other measurements to increase the signal-to-noise of the measurement of $\vec{B}_{ext}$. The polarity of the bias magnetic field may be flipped periodically, e.g., at a polarity reversal frequency that is slower than the repetition frequency of the measurement 781 used to probe the solid-state sensor 600. At the same time, the polarity reversal frequency should be high enough to move the 1/f noise from the current source far enough away from the frequency or frequencies of interest so that the noise can be filtered out. In typical current sources, 1/f noise begins to dominate around 1 Hz to 100 Hz; even in state-of-the-art precision current sources such as those shown in FIG. 5, 1/f noise is the dominant source of noise for frequencies below 0.1 Hz. Thus, suitable polarity reversal frequencies include values from about 0.1 Hz to about 100 Hz (e.g., 1 Hz, 10 Hz, or any other value between 0.1 Hz and 100 Hz).

The polarity of the bias magnetic field may also be flipped aperiodically. For example, reversing the bias field polarity according to some pseudo-random scheme (e.g., using pseudo-random time intervals between reversals) has the effect of increasing the bandwidth of the chopping signal. In an analogous manner to spread-spectrum techniques, this spreads bias noise over a larger bandwidth, thus reducing the noise's magnitude and contribution to the measurement. Note that bias drift considerations may impose a bound on the maximum time between reversals. This and other schemes employing aperiodic and/or arbitrary reversals and/or variations of the bias field can improve the robustness of the measurement against unwanted noise and/or nonlinearities.

Analog Circuit for Generating Current

Figure 8:
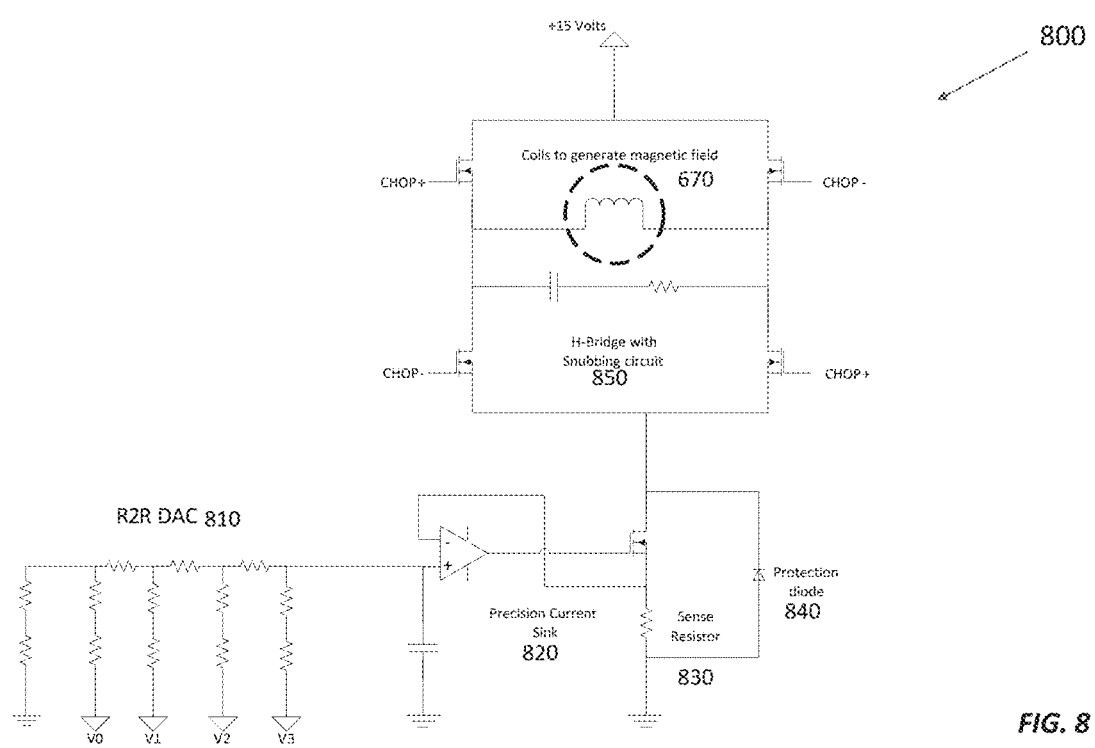
FIG. 8 shows circuitry for driving coils with an alternating current to produce a chopped bias magnetic field.

FIG. 8 shows one example of the analog circuit 680 used to create the current for generating the time-varying bias magnetic field. It includes an R-2R digital-to-analog converter (DAC) 810 coupled to a precision current sink 820 that drives the coils 670*a*, 670*b* via an H-bridge with a snubbing circuit 850. A sense resistor 830 monitors the current flow, and a protection diode 840 prevents current from flowing in the wrong direction.

The current source 680 should be low noise (i.e., the amplitude variations of the current created by the current source should be as low as possible). This desire for low noise is driven by variation of the bias magnetic field's amplitude with on the current's amplitude: as the current's amplitude goes up and down, the bias magnetic field's amplitude will go up and down proportionately. For example, the noise level may be about one part per billion (ppb) per root Hertz. If the current source 680 creates a current of 1 Ampere, this means that the amplitude variation of the current should be $10^{-9}$ Amperes/$\sqrt{Hz}$ or lower. Similarly, a bias magnetic field with an amplitude of 1 Tesla may vary in amplitude by about $10^{-9}$ Tesla/$\sqrt{Hz}$ or less.

The analog circuit 680 can reverse the direction of current flow quickly, e.g., in 100 microseconds, 90 microseconds, 80 microseconds, 70 microseconds, 60 microseconds, 50 microseconds, or less. The reversal of the current should result in little to no ringing. This can be achieved by engineering the magnetic field reversal to within a range of slightly underdamped to slightly overdamped, e.g., with a damping ratio between 0.75 and 1.25.

Bias Coils

The bias coils 670*a* and 670*b* are multi-turn coils that are large enough to produce a uniform magnetic field over the volume of the solid-state spin sensor 610. They should also be wide enough to fit around the substrate 612 holding the solid-state spin sensor 610, where a larger substrate 612 allows for better heat dissipation. The bias coils, in combination with the snubbing circuit, should yield a circuit settling time of 1 ms or less. This determines how quickly the current source 680 and coils 670a and 670b can switch the polarity of the bias magnetic field. Minimizing the polarity-switching time maximizes the useable measurement time and enables achieving optimal SNR and measurement sensitivity.

For an NV diamond solid-state spin sensor mounted on a SiC wafer with a diameter of 2 inches, the bias coils should have in inner diameter of at least 2 inches. Making the coil inner diameter a little larger (e.g., 2.375 inches in diameter) provides extra room for access.

The coils' inductance can be reduced or minimized by minimizing the coil size and the number of turns as well as increasing or maximizing the wire diameter. This reduces the circuit's time constant. However, as discussed above, the coil size should be large enough to produce a uniform bias magnetic field over the sensor volume. Additionally, the coils should apply a bias magnetic field high enough to split the NV resonances, which can be accomplished with higher current and more turns. The electronics and heat dissipation limit the current running through the coil to about 10 Amperes. Thus, a balance should be struck between minimizing inductance, maximizing bias field uniformity, and remaining within reasonable bias current and bias field values, which have opposing constraints on the coil size, number of turns, and bias current employed. A coil with eight turns using wire with a diameter of about 1.35 mm satisfies these design considerations.

Figure 9A:
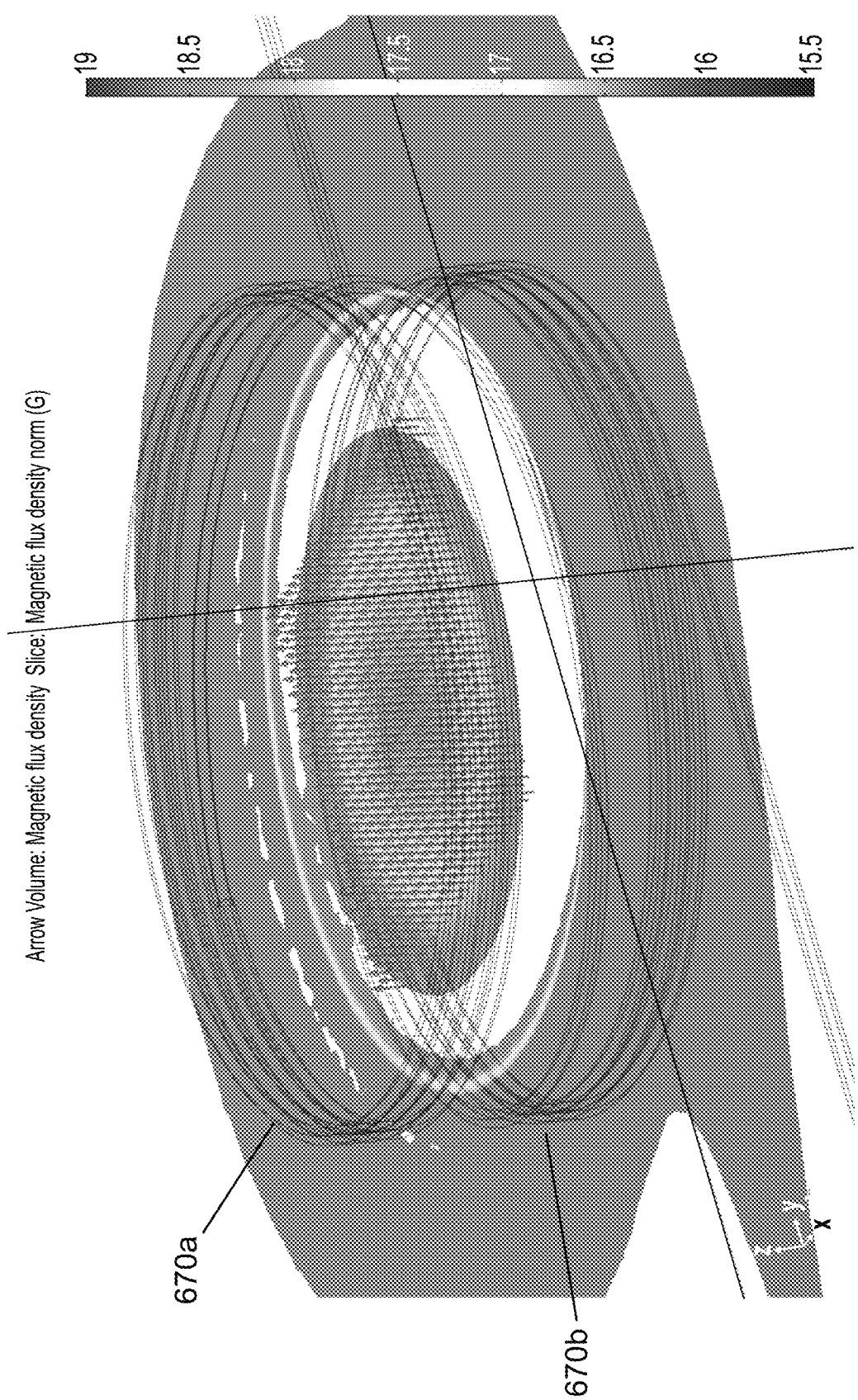
FIGS. 9A and 9B are finite element analysis simulations of wire coils for producing a chopped bias magnetic field.
Figure 9B:

FIGS. 9A and 9B show finite element analysis (COMSOL) simulations of the magnetic field generated by 8-turn coils with a wire diameter of 1.35 mm and an inner diameter of about 2.375 inches. The size of the bounding box containing the simulated coils can affect the simulation, so it was set to about 15 times the coil diameter, which was found empirically to be the smallest size that did not alter the simulated field. Simulating a block of air with the finest mesh in the volume around the diamond where we care the most yielded data in a 5 mm×5 mm×1 mm volume in the center of the coil. This block corresponded to the solid-state spin sensor.

FIGS. 10A-10F show the x, y, and z components of the magnetic fields in slices at z=0 mm and z=−0.5 mm in that volume (z=+0.5 mm should be the same as z=−0.5 mm by symmetry). The dashed boxes in these figures indicate a 2 mm×2 mm area, which is roughly the size of the solid-state spin sensor (NV diamond sample). A current of 8 Amps produces a field magnitude of approximately 16 Gauss at the center of the coil. There is little to no field component in the x direction, a larger but still very small component in the y direction, and the majority of the field in the z direction. The slight asymmetry is not surprising given the single wide-pitch turn.

FIGS. 10G-10L show the x, y, and z components of the magnetic fields as fractions of the field magnitude in slices at z=0 mm and z=−0.5 mm. This changes the x field component a little, not by an appreciable amount. There is no discernible difference in the y and z components of the magnetic field.

FIGS. 10M-10Q show the magnetic field in terms of the polar and azimuthal angles. The change in z only causes a <0.1-degree change in the azimuthal direction, suggesting that z positioning of the coils with respect to the solid-state spin sensor is not critical. Across the solid-state spin sensor, there is roughly a 2.23 mG range in the normalized magnetic field magnitude $|\vec{B}_{bias}|$ (corresponding to a linewidth broadening of about 10 kHz), and a 0.0006-degree range in the 0.6717-degree polar angle. The non-uniformity across the solid-state spin sensor is not expected to be an issue. If the 0.6717-degree polar angle affects the measurements, the SiC wafer holding the solid-state spin sensor can be tilted or rotated to compensate.

Device Performance

Figure 11:
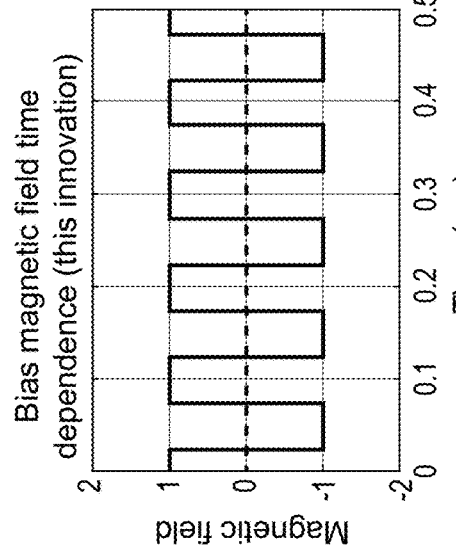
FIG. 11 is a plot of bias magnetic field amplitude versus time for a bias magnetic field applied with a permanent magnet or coils driven with a constant current.
Figure 12:
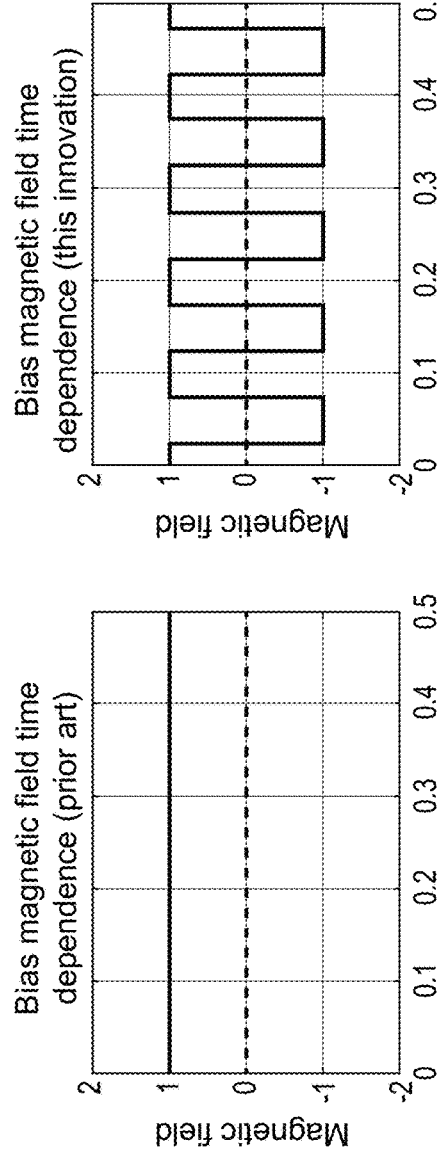
FIG. 12 is a plot of periodically varying bias magnetic field amplitude versus time for a bias magnetic field applied with coils driven by a current whose polarity flips periodically.

In a conventional solid-state spin sensor, the bias magnetic field is constant as shown in FIG. 11. Conversely, in an inventive solid-state spin sensor, the bias magnetic field changes polarity as shown in FIG. 12. If the current through the magnetic field coils can be exactly reversed, the 1/f noise from the current source can be suppressed or eliminated, dramatically improving the solid-state spin sensor's sensitivity at low frequencies (e.g., millihertz (mHz) frequencies).

Figure 13:
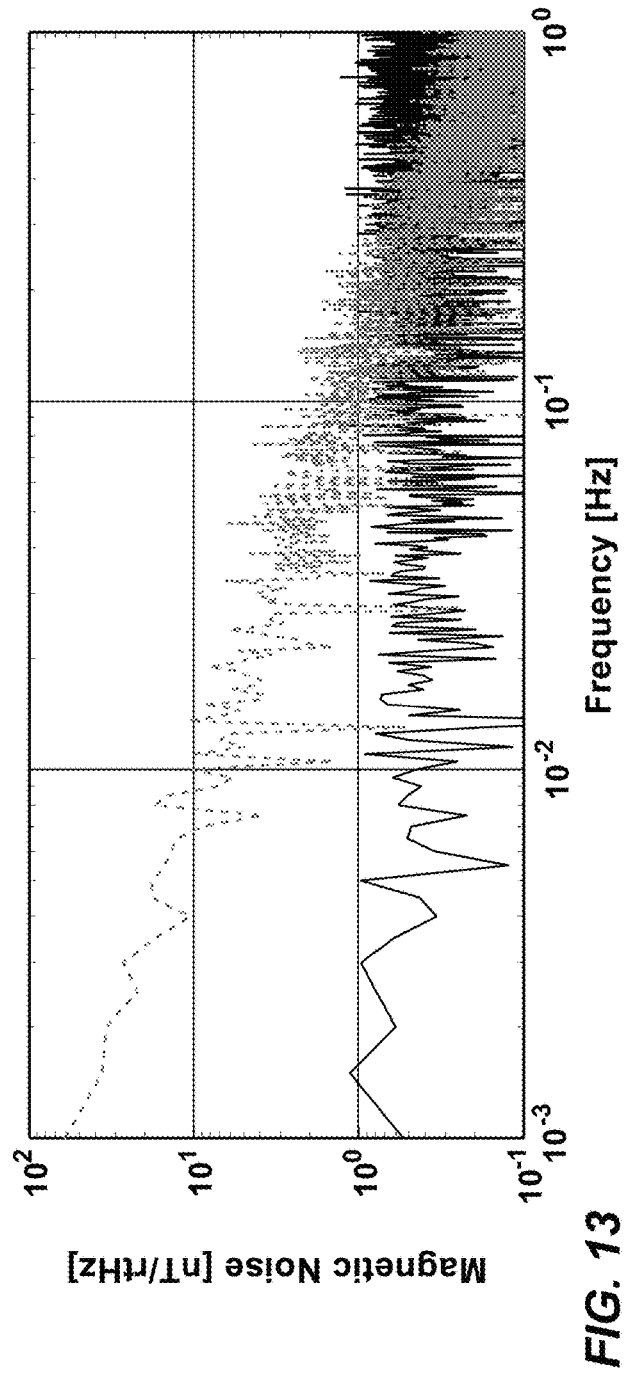
FIG. 13 is a plot of magnetic field noise versus frequency for a measurement extracted using periodically varying bias magnetic field compared to a measurement extracted using a fixed bias magnetic field applied with a permanent magnet or coils driven with a constant current.

FIG. 13 is a plot of magnetic field noise (sensitivity) versus frequency for conventional and inventive solid-state spin sensors. The dashed trace represents the magnetic sensitivity of a solid-state magnetometer without the reversal of the bias magnetic field. The solid black trace depicts the magnetic sensitivity of a solid-state magnetometer with periodic polarity reversal of the bias magnetic field. At mHz frequencies, the solid-state spin sensor with periodic polarity reversal displays a sensitivity of approximately 0.6 nT/$\sqrt{Hz}$ while the solid-state spin sensor employing a constant magnetic bias field achieved a sensitivity of approximately 60 nT/$\sqrt{Hz}$. This shows that reversing the polarity of the bias magnetic field improves the sensitivity by a factor of 100.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of measuring an external magnetic field with a solid-state host, the solid-state host comprising an ensemble of color center defects, each color center defect in the ensemble of color center defects having a corresponding resonance, the method comprising:
    applying a time-varying bias magnetic field to the ensemble of color center defects with a magnetic field source in electromagnetic communication with the ensemble of color center defects, the time-varying bias magnetic field splitting the resonances of the color center defects in the ensemble of color center defects;
    measuring shifts in the resonances of the color center defects caused by the external magnetic field and the time-varying bias magnetic field; and
    determining a magnitude and/or direction of the external magnetic field based on the shifts in the resonances of the color center defects and the time-varying bias magnetic field,
    wherein applying the time-varying bias magnetic field comprises reversing a polarity of the time-varying bias magnetic field,
    wherein measuring the shifts in the resonances of the color center defects comprises:
        irradiating the color center defects with microwave radiation from a microwave source in electromagnetic communication with the color center defects, the microwave radiation manipulating respective quantum spin states of the color center defects;
        illuminating the color center defects with optical radiation from a light source in optical communication with the color center defects, the optical radiation causing the color center defects to emit fluorescent light; and
        detecting a spectroscopic signature of the color center defects in response to the optical radiation and the microwave radiation with a detector in electromagnetic communication with the color center defects.

2. The method of claim 1, wherein reversing the polarity of the time-varying bias magnetic field comprises periodically reversing the polarity of the time-varying bias magnetic field.

3. The method of claim 1, wherein reversing the polarity of the time-varying bias magnetic field comprises:
    alternating a direction of a current running through wire coils so as to alternate the polarity of the time-varying bias magnetic field.

4. The method of claim 3, wherein alternating the direction occurs at a rate of about 0.1 Hz to about 1 kHz.

5. The method of claim 3, wherein alternating the direction occurs at a rate of about 1 Hz to about 10 Hz.

6. The method of claim 3, wherein alternating the direction comprises changing the direction of the current within less than 100 microseconds.

7. The method of claim 1, further comprising:
    generating the time-varying bias magnetic field with an amplitude variation of less than about $10^{-9}/\sqrt{Hz}$ at frequencies higher than a reversal frequency of the time-vary bias magnetic field.

8. The method of claim 1, wherein
the optical radiation comprises optical pulses and the microwave radiation comprises microwave pulses, and
wherein applying the time-varying bias magnetic field comprises reversing the polarity of the time-varying bias magnetic field at a reversal frequency lower than a pulse repetition frequency of the optical pulses.

9. The method of claim 1, wherein
the optical radiation comprises a continuous-wave optical radiation and the microwave radiation comprises a modulated microwave radiation,
wherein applying the time-varying bias magnetic field comprises reversing the polarity of the time-varying bias magnetic field at a reversal frequency lower than a modulation frequency of the modulated microwave radiation.

10. The method of claim 1, wherein determining the magnitude and/or direction of the external magnetic field comprises measuring the magnitude of the external magnetic field with a sensitivity of 1 nT/$\sqrt{Hz}$ or less.

11. A magnetic field sensor comprising:
a solid-state host containing color center defects having respective resonances, the respective resonances shifting in response to an external magnetic field;
a magnetic field source, in electromagnetic communication with the color center defects, to apply a time-varying bias magnetic field to the color center defects, the time-varying bias magnetic field splitting the respective resonances of the color center defects;
at least one radiation source, in electromagnetic communication with the color center defects, to irradiate the color center defects with radiation;
a detector, in electromagnetic communication with the color center defects, to detect a spectroscopic signature of the color center defects in response to the radiation; and
a processor, operably coupled to the detector, to determine an amplitude and/or direction of the external magnetic field based on the time-varying bias magnetic field and the spectroscopic signature of the color center defects,
wherein the magnetic field source is configured to reverse a polarity of the time-varying bias magnetic field, and
wherein the at least one radiation source comprises:
a microwave source, in electromagnetic communication with the color center defects, to irradiate the color center defects with microwave radiation, the microwave radiation manipulating respective quantum spin states of the color center defects; and
a light source, in optical communication with the color center defects, to illuminate the color center defects with optical radiation, the optical radiation causing the color center defects to emit fluorescent light.

12. The magnetic field sensor of claim 11, wherein the magnetic field source is configured to periodically reverse the polarity of the time-varying bias magnetic field.

13. The magnetic field sensor of claim 12, wherein the magnetic field source is configured to periodically reverse the polarity of the time-varying bias magnetic field at a rate of about 0.1 Hz to about 1 kHz.

14. The magnetic field sensor of claim 12, wherein the magnetic field source is configured to periodically reverse the polarity of the time-varying bias magnetic field at a rate of about 1 Hz to about 10 Hz.

15. The magnetic field sensor of claim 11, wherein the magnetic field source comprises:
coils in electromagnetic communication with the solid-state host; and
circuitry, in electrical communication with the coils, to apply an alternating current to the coils.

16. The magnetic field sensor of claim 15, wherein the circuitry has a time constant of less than about 100 microseconds.

17. The magnetic field sensor of claim 15, wherein the circuitry comprises:
a current source to generate the current with an amplitude variation of less than about $10^{-9}$ A/$\sqrt{Hz}$.

18. The magnetic field sensor of claim 11, wherein the at least one radiation source is configured to apply the radiation as pulses at a pulse repetition frequency greater than a modulation frequency of the time-varying bias magnetic field.

19. The magnetic field sensor of claim 11, wherein the processor is configured to determine a magnitude of the DC magnetic field with a sensitivity of 1 nT/$\sqrt{Hz}$ or less.

20. The magnetic field sensor of claim 11, wherein the processor is configured to determine a magnitude of the DC magnetic field by averaging measurements made under opposite polarities of the time-varying bias magnetic field.

21. The magnetic field sensor of claim 11, wherein the magnetic field source is configured to aperiodically reverse the polarity of the time-varying bias magnetic field.

22. The magnetic field sensor of claim 11, wherein the magnetic field source is configured to reverse the polarity of the time-varying bias magnetic field at pseudo-random time intervals.

* * * * *